(12) United States Patent
Tapio et al.

(10) Patent No.: US 6,741,663 B1
(45) Date of Patent: May 25, 2004

(54) LINEARIZATION METHOD FOR AMPLIFIER, AND AMPLIFIER ARRANGEMENT

(75) Inventors: Olli Tapio, Jääli (FI); Toni Neffling, Espoo (FI)

(73) Assignee: Nokia Corporation, Espoo (FI)

( * ) Notice: Subject to any disclaimer, the term of this patent is extended or adjusted under 35 U.S.C. 154(b) by 553 days.

(21) Appl. No.: 09/702,922

(22) Filed: Oct. 27, 2000

Related U.S. Application Data

(63) Continuation of application No. PCT/FI99/00352, filed on Apr. 28, 1999.

(30) Foreign Application Priority Data

Apr. 30, 1998 (FI) .................................................. 980967

(51) Int. Cl.[7] .......................... H04K 1/02; H04L 25/03; H04L 25/49
(52) U.S. Cl. ..................................................... 375/297
(58) Field of Search ................................ 375/295, 296, 375/297, 285; 330/75, 149, 207 R

(56) References Cited

U.S. PATENT DOCUMENTS

| | | | | |
|---|---|---|---|---|
| 5,113,414 A | * | 5/1992 | Karam et al. ................ | 375/296 |
| 5,923,712 A | * | 7/1999 | Leyendecker et al. ....... | 375/297 |
| 6,075,411 A | * | 6/2000 | Briffa et al. ................. | 330/149 |
| 6,141,390 A | * | 10/2000 | Cova .......................... | 375/297 |

* cited by examiner

Primary Examiner—Jean B. Corrielus
(74) Attorney, Agent, or Firm—Squire, Sanders & Dempsey, L.L.P.

(57) ABSTRACT

The invention relates to a linearization method for an RF amplifier and an arrangement implementing the method. A difference between an output signal of the amplifier and an unpredistorted input signal supplied to the amplifier is formed from baseband, quadrature components by means of a complex LMS algorithm in adaptation means. On the basis of the signal difference, the non-linearity of the amplifier is adaptively corrected before a quadrature modulator by changing the values of the complex quadrature components of the baseband signal by means of digital predistortion coefficients retrieved from a memory.

19 Claims, 2 Drawing Sheets

LINEARIZATION METHOD FOR AMPLIFIER, AND AMPLIFIER ARRANGEMENT

This application is a continuation of international application serial number PCT/FI99/00352, filed Apr. 28, 1999.

FIELD OF THE INVENTION

The invention relates to correcting non-linear operation of amplifiers operating on radio frequencies. The invention particularly relates to a linearization method for an RF amplifier, in which method a digital input signal is divided into complex, baseband quadrature components employed by quadrature modulation, and the digital input signal is quadrature-modulated into a radio frequency signal and amplified.

The invention further relates to a linearized RF amplifier arrangement comprising a quadrature modulator arranged to quadrature-modulate a digital input signal into a radio frequency signal, which an amplifier is arranged to amplify.

BACKGROUND OF THE INVENTION

The operating range of radio-frequency power amplifiers is wider than that of small-signal amplifiers. Hence, the power amplifiers are non-linear, which results in amplitude distortion and phase distortion. These non-linearities generate frequencies in the output signal that did not exist in the original signal. For example, a base station in a cellular radio system receives and amplifies signals of different frequencies of a plurality of terminals simultaneously, in which case, at worst, a non-linear amplifier makes a radio signal to be transmitted to spread within the frequency range to the range used by the adjacent terminal. It has been the aim of the prior art solutions to correct signal distortion caused by power amplifier intermodulation by feedforwarding or predistorting. In feedforward solutions, two control loops provided with a main amplifier and for the actual signal and a distortion amplifier for signal distortion are typically applied. Distortion feedforwarding is thus used for correcting the actual signal.

In the prior art solution using predistortion, an estimate is made of the manner in which an amplifier will distort a signal. The signal to be amplified by means of the estimate is predistorted by a distortion transformation opposite to the amplifier distortion, in other words the aim is to find out the inverse function of the distortion caused by the amplifier. The amplifier then, while amplifying the signal, simultaneously compensates for the predistortion, yielding an undisturbed, 'linearized' signal.

In the prior art solutions, predistortion is performed either analogically or digitally. In analogue predistortion, it is difficult to detect changes in amplifier distortion; hence, digital predistortion is more preferable. Digital predistortion enables distortion to be corrected extremely efficiently. A typical digital predistortion is performed by using look-up tables that, most preferably, are to be updated in order to achieve adaptability, since amplifier distortion is affected by the amplifier's age, temperature, and changes in the signal fed to the amplifier, for instance. U.S. Pat. No. 5,049,832, which is incorporated herein by reference, discloses such a solution. In the solution of the publication, predistortion information is stored in a memory in rectangular coordinate form, which aims to reduce the amount of information to be stored; hence, an attempt is made to quicken the adaptability of the solution in changing circumstances. Particularly in view of the algorithm, the prior art solutions of this type are not, however, sufficiently stable in the changing circumstances, which causes the amplified signal to be harmfully distorted.

BRIEF DESCRIPTION OF THE INVENTION

An object of the invention is thus to provide a method and an arrangement implementing the method so as to solve the above problems.

This can be achieved by a method of the type described in the introduction, which is characterized by forming, from the baseband quadrature components, a difference between an output signal of the amplifier and the unpredistorted input signal supplied to the amplifier by means of an LMS algorithm or the like, forming a digital predistortion coefficient on the basis of the signal difference, and adaptively correcting the non-linearity of the amplifier before the quadrature modulation by changing the values of the complex quadrature components of the baseband input signal by means of a digital predistortion coefficient.

The amplifier arrangement of the invention is characterized in that it comprises adaptation means for forming a difference between an output signal of the amplifier and the unpredistorted input signal supplied to the amplifier from the baseband quadrature components by means of an LMS algorithm or the like, predistortion means for adaptively correcting the non-linearity of the amplifier before the quadrature modulator by changing the values of the complex quadrature components of the baseband input signal by means of a digital predistortion coefficient.

Several advantages can be achieved by the method and arrangement of the invention. Predistortion becomes more stable, and amplifier distortion is reduced.

BRIEF DESCRIPTION OF THE DRAWINGS

The invention will now be described in closer detail in connection with the preferred embodiments with reference to the accompanying drawings, in which.

DETAILED DESCRIPTION OF THE INVENTION

Figure 1:
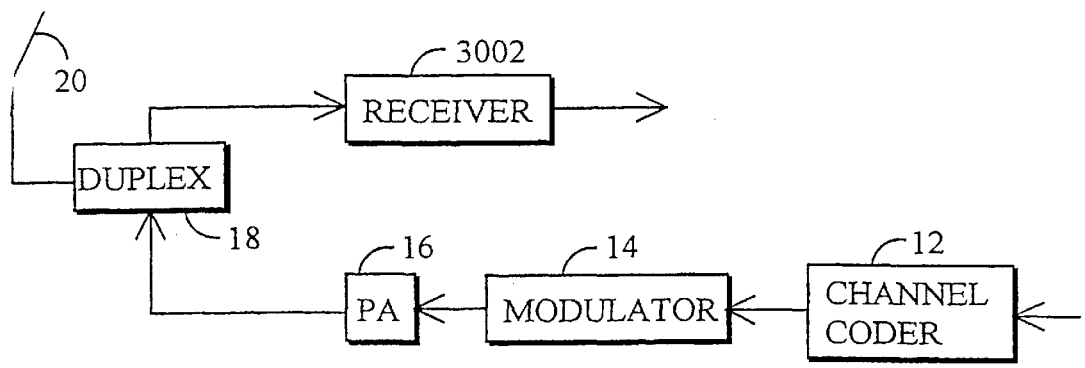
FIG. 1 shows a transceiver.

The solution of the invention is particularly suited for amplifying a radio-frequency signal in a transmitter of a radio system. Cellular radio systems to which the solution of the invention can be applied to include the GSM (Global System for Mobile Communication), DCS-1800 (Digital Cellular System), CDMA (Code Division Multiple Access) and WCDMA (Wideband CDMA).

First, let us generally examine a typical transceiver of a radio system, which can be a terminal or a base station. Let us first discuss signal reception. A signal is received by an antenna 20 from which it propagates to a duplex filter 18. The duplex filter 18 separates the transmitter side and the receiver side. The received signal propagates from the duplex filter 18 to an actual receiver part 10, in which the signal is usually demodulated and decoded for detecting transmitted data. Let us now discuss signal transmission. Data to be transmitted is first received by a channel coder 12 which encodes, and usually also interleaves, the signal against fadings and interference occurring in the channel. The encoded signal propagates to a modulator 14, which, particularly in the solution of the invention, quadrature-modulates the signal. Furthermore, the modulator 14 converts the signal into a radio frequency one. Next, the signal is further amplified in a power amplifier 16 and conveyed to the duplex filter 18. The signal transmitted from the duplex filter 18 passes to the antenna 20 and spreads in the environment as electromagnetic radiation.

Figure 2:
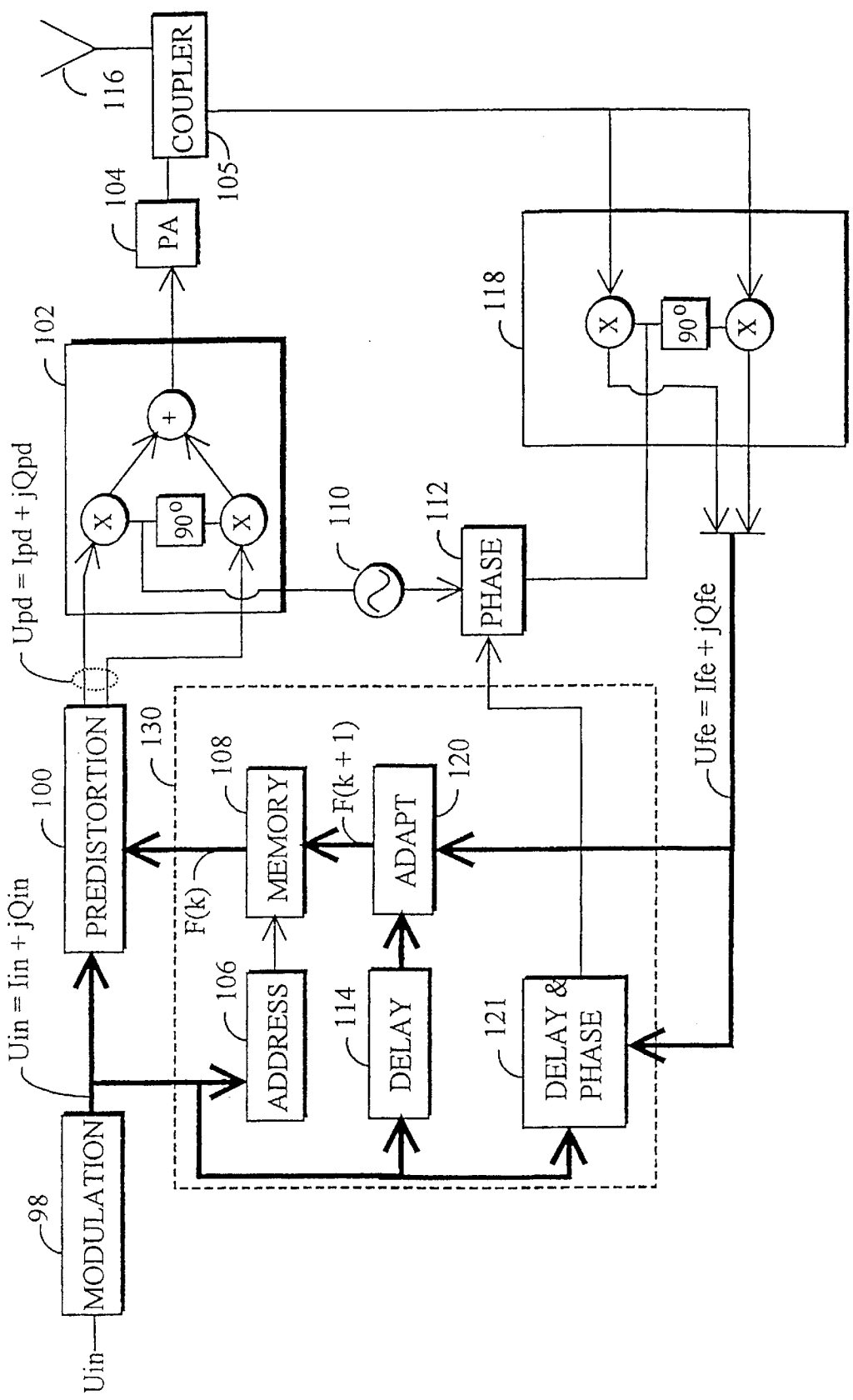
FIG. 2 shows an amplifier arrangement.

First, let us view the operation of a quadrature modulator 102 and a quadrature demodulator 118 by means of FIG. 2. Data transmitted in quadrature modulation is divided into two parts in a digital modulator 98. The first data part Ipd is multiplied by a carrier coming from a carrier generator 110, and the second data part Qpd is multiplied by a phase-shifted carrier. As shown in block 102, the sum of these parts thus yields a signal supplied to an amplifier 104. In the quadrature modulator 118, in turn, the output signal of the amplifier 104 is multiplied both by the carrier without phase shift and by the phase-shifted carrier. Without phase shift, multiplying by the carrier can be expressed, for instance, in such a manner that the data is multiplied by a cosine carrier, which is of the form $\cos(\omega_c t)$. Multiplying by the phase-shifted carrier can be expressed in such a manner that the signal is multiplied by a sine carrier, which is of the form $\sin(\omega_c t)$. Hence, carriers having a $\pi/2$ phase shift between them are used in multiplying the signals. Since the different parts of the signal are orthogonal with respect to each other owing to the $\pi/2$ phase shift, the data parts can be expressed by using a complex way of expression. Hence, a data signal U to be transmitted, for instance, can be expressed in the form U=I+jQ, where I (Inphase) is the first data part, Q (Quadrature) the second part, and j an imaginary unit. The prior art quadrature modulators allow the wave form of both I and Q data parts to be modified before the multiplication by the carrier. In the CDMA technique, I and Q data parts are also multiplied by a spreading code before multiplying by the carrier.

Let us now take a closer look at the operation of the amplifier arrangement of the invention by means of FIG. 2. A signal Uin to be amplified is first converted from a serial-mode signal into two parallel signal components in the digital modulator 98. This conversion divides the signal into two parts (Iin and Qin, which is the aim in quadrature modulation. Predistortion is generated in predistortion means 100 as a multiplication of a complex input signal Uin=Iin+jQin and a complex predistortion coefficient F=Fi+jFq, whereby predistorted, baseband signal components Ipd and Qpd obtained are:

$$Ipd=Fi*Iin-Fq*Qin$$

$$Qpd=Fi*Qin+Fq*Iin.$$

Hence, predistorted signal Upd is Upd=Ipd+jQpd. Next, the signal components are quadrature-modulated in the IQ modulator 102, amplified in the RF amplifier 104, and transmitted via an antenna 116. In the solution of the invention, an output signal Ufe of the amplifier 104, which comprises a complex component Ufe=Ife+jQfe, is fed back by a directional coupler 105 before the antenna 116, and quadrature-demodulated into a baseband one in the IQ modulator 118. The feedback, baseband and complex signal Ufe is compared with the baseband, unpredistorted input signal Uin in adaptation means 120. The input signal Uin must be delayed in delaying means 114 to enable the timing of the digital symbols of the input signal Uin and the output signal Ufe to correspond to each other. The delaying process is controlled by a control block 121 of delay and phase, which compares the input signal Uin and the demodulated signal Ufe. The adaptation means 120 change the complex coefficient F=Fi+jFq modelling the inverse function of the distortion of the amplifier 104 such that the difference between the input signal Uin and the output signal Ufe is minimized. This can be performed by minimizing the squared error, for instance. A common LSE (Least Square Error) problem can be solved by using a Kalman algorithm, a modified Kalman algorithm (Extended Kalman Algorithm), an RLS (Recursive Least Square) algorithm or an LMS (Least Mean Square) algorithm in the adaptation means 120. The adaptation means 120 preferably implement the minimizing algorithm. Lets us take a closer look at an LMS algorithm based on minimizing the mean square of such a difference, i.e. error. The function for difference e(n) at a moment corresponding to sample n is:

$$e(n)Uin(n)-Ufe(n).$$

This difference e(n) is used for forming complex predistortion coefficients F=Fi+jFq in a following, iterative manner:

$$F(k+1)=F(k)-\mu\nabla e^2(n),$$

where k is the iteration index. Thus, predistortion coefficient F obtained is:

$$F(k+1)=F(k)+2\mu e(n)\overline{Uin(n)},$$

where $\overline{Uin(n)}$ is the complex conjugate of the input signal. The iterated predistortion coefficients F are stored in a memory 108, in which case they replace the previous predistortion values. In principle, the memory can include any number, for example a real 1, stored in it as initial values for the predistortion coefficients F. Weighting coefficient $\mu$ determines the converging rate of the adaptation and the magnitude of the remaining difference. In view of stability, $0<\mu<2$/Ptot is valid for weighting coefficient $\mu$, where Ptot is the total power of the input signal Uin.

The predistortion coefficients F are retrieved from the memory on the basis of the input signal Uin. However, the input signal Uin as such cannot be used as the address of the memory 108, but the address is formed in address calculation means 106. The address in the predistortion table 108 is formed by means of the amplitude of the input signal Uin. Depending on the type of the amplifier 104, the address can be calculated in the calculation means 106 either as the sum of the squares of input signals:

$$address=round((k-1)*(Iin^2+Qin^2)/2+1, \text{ or}$$

as the square root of the sum of the squares of the input signal:

$$address=round((k-1)*sqrt((Iin^2+Qin^2)/sqrt(2)+1,$$

where k is the size of the predistortion table, round is the rounding to the nearest integer number, and sqrt refers to the square root. In these formulas, Iin and Qin are normalized on a unit circle such that their values vary between [−1, 1]. When an amplifier is non-linear mainly at high input signal power levels, the address to be preferably used is the sum of squares since there is a greater number of addresses at high values. When an amplifier is non-linear at low input signal power levels as well, it is preferable to use the square root of the sum of the squares as the address. Hence, the predistortion coefficient F, which is of the form F(k+1)=F(k)+2$\mu$e(n)Uin(n), is the output of the table memory 108. The predistortion coefficients thus are:

$$Fi(k+1)Fi(k)+\mu\{(Iin^2+Qin^2-Iin*Ife-Qin*Qfe\}$$

$$Fq(k+1)=Fq(k)+\mu\{Qin*Ife-Iin*Qfe\}.$$

Hence, also weighting coefficient $\mu$ is calculated separately for each address range in such a manner that:

$$\mu < \frac{0.5}{Iin^2+Qin^2}.$$

Figure 3A:
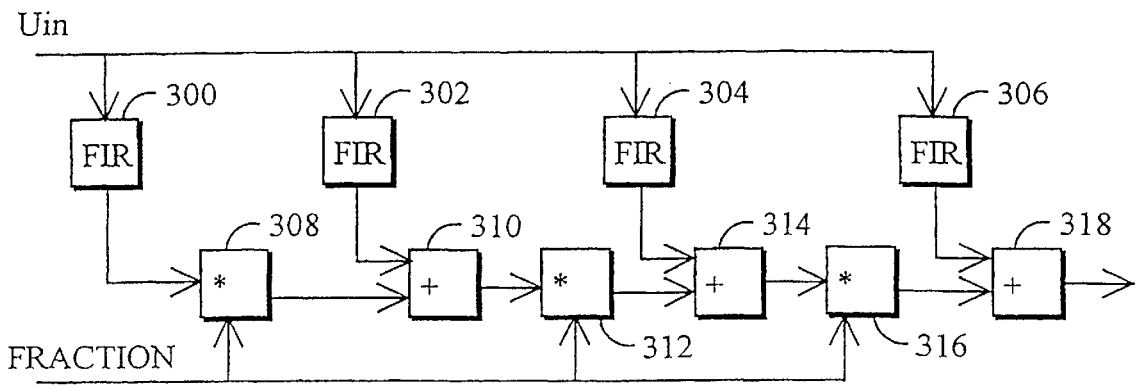
FIG. 3A shows how delay is generated.

Delay control in the delaying means 114 must be estimated with sufficient accuracy. The delay is estimated by transmitting and receiving a pseudo noise sequence of the M sequence type, for instance. Other sequences with sufficiently good autocorrelation characteristics can also be used as pseudo noise sequences. An advantage of the M sequences is that they can be readily generated by means of a shift register, and their autocorrelation is a narrow peak. The delay result is estimated in the control means 121 by calculating the correlation between a transmitted and a received sequence. The delaying means 114 delay the input signal by a length corresponding to the calculated delay result. A correlation of this kind allows the delay to be calculated with an accuracy of entire samples. Even more accurately than one sample, the delay can be calculated as a fractional delay for instance in a following manner:

$$\text{fraction} = \frac{NCorr-PCorr}{NCorr+PCorr+MaxCorr-3*\min(NCorr,MaxCorr,PCorr)},$$

where MaxCorr is the highest value of the correlation, Ncorr the next value to the maximum correlation, and Pcorr the value preceding the maximum value. Mathematically, the correlation $C(\tau)$ for functions $x(t)$ and $y(t)$ is formed for instance in the following manner:

$$C(t) = \int_a^b x(\tau)y(\tau+t)\,d\tau,$$

where a and b represent the calculation period of the correlation. Digitally, correlation row C is calculated as a cross product for sequences X and Y in the following manner:

$$C(n) = \sum_{i=1}^N x(i)y(n+i),$$

where each C(n) corresponds to an element of correlation row C. When Y is sequence X delayed in the transmitter, the delay of the transmitter can be defined. A fractional value thus formed is used in a digital fractional value filter, which delays the signal sufficiently. Preferably, the input signal Uin is actively and continuously delayed, in which case the transmitter, to keep the delay optimal, recurrently transmits a pseudo-random sequence through the amplifier 104. FIG. 3A shows the implementation of such a fractional delay as a arrow structure. The input signal Uin and the fractional result formed serve as the inputs of the Farrow structure. The input signal Uin is fed into four FIR (Finite Impulse Response) filters 300, 302, 304 and 306. The output of the FIR filter 300 and the fractional result are multiplied in a multiplier 308, after which the input is added to the output of the next FIR filter in a summer 310. The sum signal is multiplied by the fractional result in a multiplier 312. Next, the input is added to the output of the FIR filter 304 in a summer 314, and the sum is multiplied by the fractional result in- a multiplier 316. This input, in turn, is added to the output of the FIR filter 306 in a summer 318, whereby the output signal of the summer 318 is a signal delayed in a desired manner. A Farrow structure of this kind is a part of a delay block 114. The blocks 106, 108, 114, 120 and 121 form an adaptation part 130 of the inventive solution.

Figure 3B:
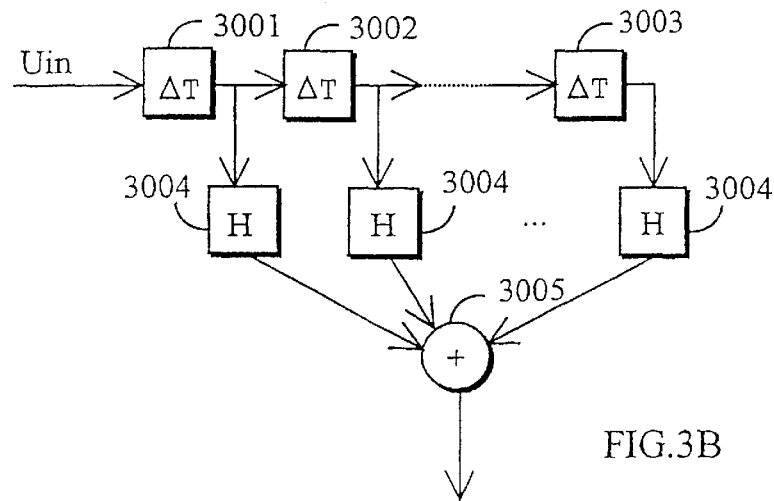
FIG. 3B shows an FIR filter.

FIG. 3B shows a general block diagram of an FIR (Finite Impulse Response) filter. The FIR filter comprises delay elements 3001 to 3003, weighting coefficient blocks 3004 and a summer 3005. The FIR filters 300 to 306 of FIG. 3A are as shown in FIG. 3B. An input signal Uin is delayed in each delay element 3001 to 3003, and the delayed signals are weighted by an appropriate weighting coefficient in the weighting coefficient blocks 3004. The delayed and weighted signals are summed in the summer 3005. The solution of the invention is provided with an almost limitless number of delay and weighting coefficient combinations to effect a desired fractional delay in the input signal in the Farrow structure. As an example can be given for instance a solution which uses an 8-tap FIR filter. Consequently, there are eight delay elements and eight weighting coefficient blocks. The weighting coefficients can all be 1, and the delay can be the same particular delay in all delay elements 3001 to 3003.

Another essential block in the inventive solution is the block 112 of phase adjustment. Consequently, the input signal and the signal amplified by the amplifier are measured in the solution of the invention. By comparing these signals, the phase adjustment block 112 is controlled to keep the up- and down-converter carriers phase-synchronized in the IQ modulators 102 and 118. Phase adjustment can also be performed in the baseband parts by means of digital signal processing by changing the phase angle of the complex input and/or feedback signal. Phase adjustment is most preferably performed in the delay and phase block 121, which controls the phase adjustment block 112. This monitoring of the carrier phases is also most preferably actively performed in the solution of the invention, in other words signal phases are continuously monitored and, if necessary, changed.

In the solution of the invention, adaptation is thus performed in the adaptation means 120 and the memory 108. Particularly for digital signal processing, the solutions of the invention can be implemented for instance by ASIC (Application-Specific Integrated Circuit) or VLSI (Very Large Scale Integration) circuits. Functions to be performed are preferably implemented as software-based microprocessor technique.

Although the invention is described above with reference to an example in accordance with the accompanying drawings, it is obvious that the invention is not restricted thereto but it can be modified in various ways within the scope of the inventive idea disclosed in the attached claims.

What is claimed is:

1. A linearization method for an RF amplifier, in which method a digital input signal is divided into complex baseband quadrature components employed by quadrature modulation, and in which method the digital input signal is quadrature-modulated into a radio frequency signal and amplified, the method comprising:

forming, from the baseband quadrature components, a signal difference between an output signal of the amplifier and an unpredistorted input signal supplied to the amplifier by means of an LMS algorithm;

forming a digital predistortion coefficient based on the signal difference;

adaptively correcting non-linearity of the amplifier before the quadrature modulation by changing values of the complex quadrature components of the unpredistorted input signal by means of the digital predistortion coefficient; and delaying the unpredistorted input signal by means of a correlation between the unpredistorted input signal and the output signal, wherein the step of delaying is arranged to form a delay as a fractional delay as follows:

$$\text{fraction} = \frac{NCorr - PCorr}{NCorr + PCorr + MaxCorr - 3*\min(NCorr, MaxCorr, PCorr)},$$

where MaxCorr is a highest value of the correlation between the unpredistorted input signal and the output signal, Ncorr is a value following the highest value, and Pcorr is a value preceding the highest value.

2. The method as claimed in claim 1, further comprising actively correcting a time difference between the unpredistorted input signal and a feedback output signal from the amplifier by delaying the unpredistorted input signal.

3. The method as claimed in claim 1, further comprising storing the predistortion coefficient in a table memory, retrieving the predistortion coefficient from the table memory by means of the unpredistorted input signal, and predistorting the unpredistorted input signal by the predistortion coefficient.

4. The method as claimed in claim 1, further comprising iterating the predistortion coefficient F(k) as follows:

$$F(k+1)=F(k)+2\mu e(n)\overline{Uin(n)},$$

where, for sample n, $\mu$ is a weighting coefficient, k is an index of iteration, e is a difference Uin(n)−Ufe(n) between the unpredistorted input signal Uin and the output signal Ufe, $\overline{Uin(n)}$ is a complex conjugate of input signal, and F(k+1) is a new predistortion coefficient stored in a table memory.

5. The method as claimed in claim 3, further comprising expressing the unpredistorted input signal as complex components employed by the quadrature modulation as follows:

$$Uin=Iin+jQin,$$

wherein Iin is a real I component of the digital input signal, Qin is an imaginary Q component of the digital input signal, and j is an imaginary unit, and wherein the digital input signal Iin+jQin is predistorted by predistortion coefficient F=Fi+jFq as follows:

$$Ipd=Fi*Iin-Fq*Qin$$

$$Qpd=Fi*Qin+Fq*Iin,$$

wherein Ipd is a distorted I component of the digital input signal, Qpd is a distorted Q component of the digital input signal, Fi is a distortion coefficient in an Inphase part of the digital input signal, and Fq is a distortion coefficient in a Quadrature part of the digital input signal.

6. The method as claimed in claim 4, further comprising calculating the weighting coefficient $\mu$ such that it is valid when:

$$\mu < \frac{0.5}{Ptot},$$

wherein Ptot is total power of the digital input signal received.

7. The method as claimed in claim 3, further comprising calculating predistortion coefficients substantially as follows:

$$Fi(k+1)=Fi(k)+\mu\{(Iin^2+Qin^2-Iin*Ife-Qin*Qfe\}$$

$$Fq(k+1)=Fq(k)+\mu\{Qin*Ife-Iin*Qfe\}, \text{ and}$$

calculating weighting coefficient $\mu$ such that it is substantially valid when:

$$\mu < \frac{0.5}{Iin^2 + Qin^2};$$

wherein Fi is a distortion coefficient in an Inphase part of the digital input signal, Fq is a distortion coefficient in a Quadrature part of the digital input signal, k is an index of iteration, Ife is a feedback of an Inphase signal, Qfe is a feedback of a Quadrature signal, Iin is a real I component of the digital input signal, and Qin is an imaginary Q component of the digital input signal.

8. The method as claimed in claim 1, further comprising quadrature-demodulating a feedback output signal of the amplifier, and actively maintaining phase synchronization between an input signal quadrature modulation and an output signal quadrature demodulation.

9. The method as claimed in claim 1, further comprising retrieving the predistortion coefficient from a table memory based on a sum of squares of the quadrature components of the unpredistorted input signal.

10. The method as claimed in claim 3, further comprising retrieving the predistortion coefficient from the table memory based on a square root of a sum of squares of the quadrature components of the unpredistorted input signal.

11. A linearized RF amplifier arrangement comprising a quadrature modulator arranged to quadrature-modulate a digital input signal into a radio frequency signal and an amplifier arranged to amplify, the amplifier arrangement comprising:

adaptation means for forming a difference between an output signal of the amplifier and an unpredistorted input signal supplied to the amplifier from baseband quadrature components by means of an LMS algorithm;

predistortion means for adaptively correcting nonlinearity of the amplifier before the quadrature modulator by changing values of complex quadrature components of the unpredistorted input signal by means of a digital predistortion coefficient; and delaying means for actively correcting a time difference between a baseband unpredistorted input signal and a feedback output signal from the amplifier by delaying the unpredistorted input signal, wherein the delaying means are arranged to delay the unpredistorted input signal by means of a correlation between the unpredistorted input signal and the output signal and wherein the delaying means are arranged to form the delay as a fractional delay as follows:

$$\text{fraction} = \frac{NCorr - PCorr}{NCorr + PCorr + MaxCorr - 3*\min(NCorr, MaxCorr, PCorr)},$$

where MaxCorr is a highest value of the correlation between the unpredistorted input signal and the output signal, Ncorr is a value following the highest value, and Pcorr is a value preceding the highest value.

12. The amplifier arrangement as claimed in claim 11, wherein the amplifier arrangement comprises a table memory in which the predistortion coefficient is stored, wherein the amplifier arrangement is arranged to retrieve a predistortion value from the table memory by means of the unpredistorted input signal, and wherein the predistortion means distort the unpredistorted input signal by the predistortion coefficient.

13. The amplifier arrangement as claimed in claim 11, wherein the adaptation means are arranged to iterate the predistortion coefficient F(k) as follows:

$$F(k+1)=F(k)+2\mu e(n)\overline{Uin(n)},$$

where, for sample n, $\mu$ is a weighting coefficient, k is an index of iteration, e is a difference Uin(n)–Ufe(n) between the unpredistorted input signal Uin and the feedback output signal Ufe, $\overline{Uin(n)}$ a complex conjugate of the unpredistorted input signal, and F(k+1) is a new predistortion coefficient.

14. The amplifier arrangement as claimed in claim 13, wherein the unpredistorted input signal is expressed as complex components employed by quadrature modulation as follows:

$$Uin=Iin+jQin,$$

where Iin is a real I component of the digital input signal, Qin is an imaginary Q component of the digital input signal, and j is an imaginary unit, and wherein the digital input signal Iin+jQin is predistored by predistortion coefficient F=Fi+jFq as follows:

$$Ipd=Fi*Iin-Fq*Qin$$

$$Qpd=Fi*Qin+Fq*Iin,$$

where Ipd is a distorted I component of the digital input signal, Qpd is a distorted Q component of the digital input signal, Fi is a distortion coefficient in an Inphase part of the digital input signal, and Fq is a distortion coefficient in a Quadrature part of the digital input signal.

15. The amplifier arrangement as claimed in claim 13, wherein the adaptation means are arranged to use the weighting coefficient $\mu$ which is valid when:

$$\mu < \frac{0.5}{Ptot},$$

where Ptot is total power of the digital input signal received.

16. The amplifier arrangement as claimed in claim 13, wherein the adaptation means are arranged to form the predistortion coefficient substantially as follows:

$$Fi(k+1)Fi(k)+\mu\{(Iin^2+Qin^2-Iin*Ife-Qin*Qfe)\}$$

$$Fq(k+1)=Fq(k)+\mu\{Qin*Ife-Iin*Qfe\},$$

wherein Iin is a real I component of the digital input signal, Qin is an imaginary Q component of the digitial input signal, Ife is a feedback of an inphase signal, Qfe is a feedback of a quadrature signal, k is an index of iteration, Fi is a distortion coefficient in an Inphase part of the digital input signal, Fq is a distortion coefficient in a Quadrature part of the digital input signal, and the weighting coefficient $\mu$ is calculated such that it is substantially valid when $$\mu < \frac{0.5}{Iin^2 + Qin^2}.$$

17. The amplifier arrangement as claimed in claim 11, wherein the amplifier arrangement comprises a quadrature demodulator which is arranged to quadrature demodulate the feedback output signal of the amplifier and wherein the amplifier arrangement comprises phase adjustment means for actively maintaining phase synchronization between the digital input signal of the quadrature modulator and an output signal of the quadrature demodulator.

18. The amplifier arrangement as claimed in claim 12, wherein the amplifier arrangement is arranged to retrieve the predistortion coefficient from the table memory based on a sum of squares of quadrature components of the unpredistorted input signal.

19. The amplifier arrangement as claimed in claim 12, wherein the amplifier arrangement is arranged to retrieve the predistortion coefficient from the table memory based on a square root of a sum of the square of quadrature components of the predistortion input signal.

* * * * *